US012660176B2

(12) United States Patent
Chu et al.

(10) Patent No.: US 12,660,176 B2
(45) Date of Patent: Jun. 16, 2026

(54) BACKSIDE PROGRAMMABLE MEMORY

(71) Applicant: International Business Machines Corporation, Armonk, NY (US)

(72) Inventors: Albert M. Chu, Nashua, NH (US);
Junli Wang, Slingerlands, NY (US);
Albert M. Young, Fishkill, NY (US);
Brent A. Anderson, Jericho, VT (US);
Ruilong Xie, Niskayuna, NY (US);
Carl Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 721 days.

(21) Appl. No.: 18/054,161

(22) Filed: Nov. 10, 2022

(65) Prior Publication Data

US 2024/0164089 A1    May 16, 2024

(51) Int. Cl.
*H10B 20/20* (2023.01)

(52) U.S. Cl.
CPC .................................... *H10B 20/20* (2023.02)

(58) Field of Classification Search
CPC .................................................. H10B 20/363
See application file for complete search history.

(56) References Cited

U.S. PATENT DOCUMENTS

| | | | |
|---|---|---|---|
| 8,174,124 | B2 | 5/2012 | Chiu et al. |
| 9,431,298 | B2 | 8/2016 | Perry et al. |
| 9,455,214 | B2 | 9/2016 | Maling et al. |
| 9,870,979 | B2 | 1/2018 | Batra et al. |
| 10,381,376 | B1 | 8/2019 | Nishikawa et al. |
| 10,672,831 | B2 | 6/2020 | Wang et al. |
| 11,041,211 | B2 | 6/2021 | Jain |

(Continued)

FOREIGN PATENT DOCUMENTS

WO          2009017923 A1    2/2009

OTHER PUBLICATIONS

Hsu et al., "Backside-TSV process development and integration for 2~3um small size TSV" 2016 International Symposium on Microsystems, Packaging, Assembly and Circuits Technology Conference (IMPACT) (2016): pp. 273-276.

(Continued)

*Primary Examiner* — Yara B Green
*Assistant Examiner* — Coralie A Nettles
(74) *Attorney, Agent, or Firm* — CANTOR COLBURN LLP; Kimberly Zillig

(57) ABSTRACT

Embodiments of the present invention are directed to processing methods and resulting structures having backside programmable memory cells. In a non-limiting embodiment, a front end of line structure having a plurality of programmable cells is formed such that each programmable cell includes a backside via in direct contact with a device region of the respective cell. A first portion of the backside vias defines one or more placeholder backside vias and a second portion defines one or more programmed backside vias. A back end of line structure (word line) is formed on a first surface of the front end of line structure. A backside structure is formed on a second surface of the front end of line structure opposite the first surface. The backside structure includes a backside metallization layer (bit line) in direct contact with the one or more programmed backside vias.

8 Claims, 8 Drawing Sheets

(56)  References Cited

U.S. PATENT DOCUMENTS

| | | | |
|---|---|---|---|
| 11,049,782 B2 | 6/2021 | Lee et al. | |
| 11,094,714 B2 | 8/2021 | Chen et al. | |
| 11,121,086 B2 | 9/2021 | Hiblot et al. | |
| 2008/0316790 A1* | 12/2008 | Inoue | H10B 20/00 |
| | | | 365/103 |
| 2012/0210438 A1* | 8/2012 | Zhang | G06F 12/1408 |
| | | | 726/26 |
| 2016/0268344 A1* | 9/2016 | Lin | H10B 63/20 |
| 2021/0375883 A1* | 12/2021 | Hsu | H10B 10/12 |
| 2022/0093523 A1 | 3/2022 | Shanmugam et al. | |
| 2022/0181258 A1 | 6/2022 | Liebmann et al. | |

OTHER PUBLICATIONS

List of IBM Patents or Patent Applications Treated as Related; Date Filed: Nov. 10, 2022—2 pages.

Chu et al., "Backside Programmable Gate Array," U.S. Appl. No. 18/054,160, filed Nov. 10, 2022.

Krish Chakrabarty, "Memory Design", https://web.archive.org/web/20151123022345/http://people.ee.duke.edu/~krish/teaching/Lectures/Memory_design.pdf, Nov. 23, 2015, 19 pages.

\* cited by examiner

800

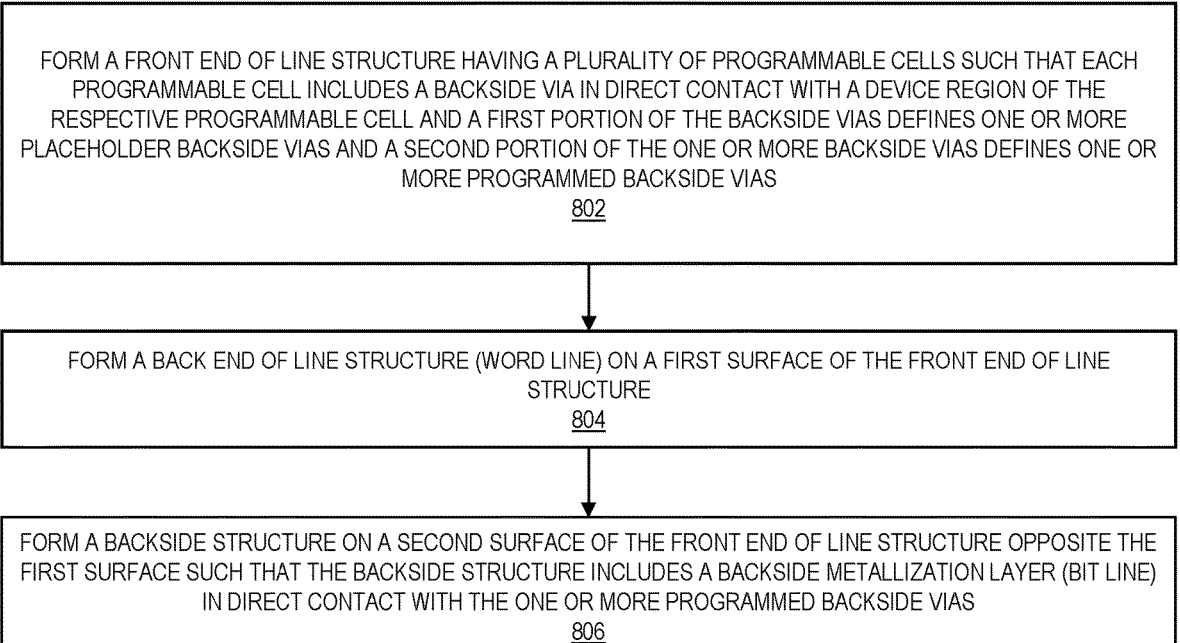

FORM A FRONT END OF LINE STRUCTURE HAVING A PLURALITY OF PROGRAMMABLE CELLS SUCH THAT EACH PROGRAMMABLE CELL INCLUDES A BACKSIDE VIA IN DIRECT CONTACT WITH A DEVICE REGION OF THE RESPECTIVE PROGRAMMABLE CELL AND A FIRST PORTION OF THE BACKSIDE VIAS DEFINES ONE OR MORE PLACEHOLDER BACKSIDE VIAS AND A SECOND PORTION OF THE ONE OR MORE BACKSIDE VIAS DEFINES ONE OR MORE PROGRAMMED BACKSIDE VIAS
802

FORM A BACK END OF LINE STRUCTURE (WORD LINE) ON A FIRST SURFACE OF THE FRONT END OF LINE STRUCTURE
804

FORM A BACKSIDE STRUCTURE ON A SECOND SURFACE OF THE FRONT END OF LINE STRUCTURE OPPOSITE THE FIRST SURFACE SUCH THAT THE BACKSIDE STRUCTURE INCLUDES A BACKSIDE METALLIZATION LAYER (BIT LINE) IN DIRECT CONTACT WITH THE ONE OR MORE PROGRAMMED BACKSIDE VIAS
806

*FIG. 8*

BACKSIDE PROGRAMMABLE MEMORY

BACKGROUND

The present invention generally relates to fabrication methods and resulting structures for semiconductor devices, and more specifically, to processing methods and resulting structures for a backside programmable memory.

The development of an integrated circuit (i.e., chip) involves several stages from design through fabrication. Many aspects of the development are performed iteratively to ensure that the chip ultimately manufactured meets all design requirements. Defining the chip architecture is one of the earliest phases of integrated circuit development. The power (e.g., power requirement), performance (e.g., timing), and area (i.e., space needed) for the resulting chip, collectively PPA, is one of the primary metrics by which integrated circuits are evaluated. PPA is largely a consequence of the chip architecture.

Semiconductor fabrication continues to evolve towards improving one or more aspects of PPA. For example, a higher number of active devices (mainly transistors) of ever decreasing device dimensions are placed on a given surface of semiconductor material. Density scaling has put a strain on the design and fabrication of the interconnects between the front end of line of the integrated circuit, consisting mainly of the active devices, and the contact terminals of the integrated circuit. In many chip architectures, all of these interconnects are incorporated in the back end of line (BEOL) structure of the integrated circuit, which includes a stack of metallization layers and vertical via connections built on top of the front end of line (FEOL) structure.

A key component of the BEOL structure is the power delivery network (PDN). The PDN of an integrated circuit is defined by the conductors and vias connected to the power supply (VDD) and ground (VSS) terminals of the chip. The PDN is responsible for delivering power to the individual devices in the front end. The integration of the PDN in the BEOL has become particularly challenging as device densities continue to scale. Backside power delivery is one known solution to this problem, and involves moving some (or most, or all) layers of the PDN from the front side of the integrated circuit to the back side. In a backside-style architecture, the repositioned layers are not formed on top of the FEOL, but are instead formed on the opposite side of the chip (i.e., on the backside of the semiconductor substrate onto which the active devices have been built).

SUMMARY

Embodiments of the invention are directed to a method for providing a backside programmable memory. A non-limiting example of the method includes forming a front end of line structure having a plurality of programmable cells such that each programmable cell includes a backside via in direct contact with a device region of the respective programmable cell. A first portion of the backside vias defines one or more placeholder backside vias and a second portion defines one or more programmed backside vias. A back end of line structure (a programmable cell control signal line, e.g., a word line) is formed on a first surface of the front end of line structure. A backside structure is formed on a second surface of the front end of line structure opposite the first surface. The backside structure includes a backside metallization layer (a sensing signal line, e.g., a bit line) in direct contact with the one or more programmed backside vias.

Embodiments of the invention are directed to a semiconductor structure. A non-limiting example of the semiconductor structure includes a front end of line structure having a plurality of programmable cells. Each memory cell includes a backside via in direct contact with a device region of the respective programmable cell. A first portion of the backside vias defines one or more placeholder backside vias and a second portion of the one or more backside vias defines one or more programmed backside vias. The structure includes a back end of line structure on a first surface of the front end of line structure. The back end of line structure includes a programmable cell control signal line. A backside structure is formed on a second surface of the front end of line structure opposite the first surface. The backside structure includes a backside metallization layer in direct contact with the one or more programmed backside vias. The backside metallization layer includes a sensing signal line.

Embodiments of the invention are directed to a semiconductor structure. A non-limiting example of the semiconductor structure includes a front end of line structure having a plurality of programmable cells. Each programmable cell includes a backside via in direct contact with a device region of the respective programmable cell. A first portion of the backside vias defines one or more placeholder backside vias and a second portion of the one or more backside vias defines one or more programmed backside vias. The structure includes a back end of line structure on a first surface of the front end of line structure. The back end of line structure includes a programmable cell control signal line (e.g., a word line) and a sensing signal line (e.g., a bit line). A backside structure is formed on a second surface of the front end of line structure opposite the first surface. The backside structure includes a backside metallization layer in direct contact with the one or more programmed backside vias. The backside metallization layer includes a backside power delivery network.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 8 depicts a flow diagram illustrating a method according to one or more embodiments of the invention.

Figure 1:
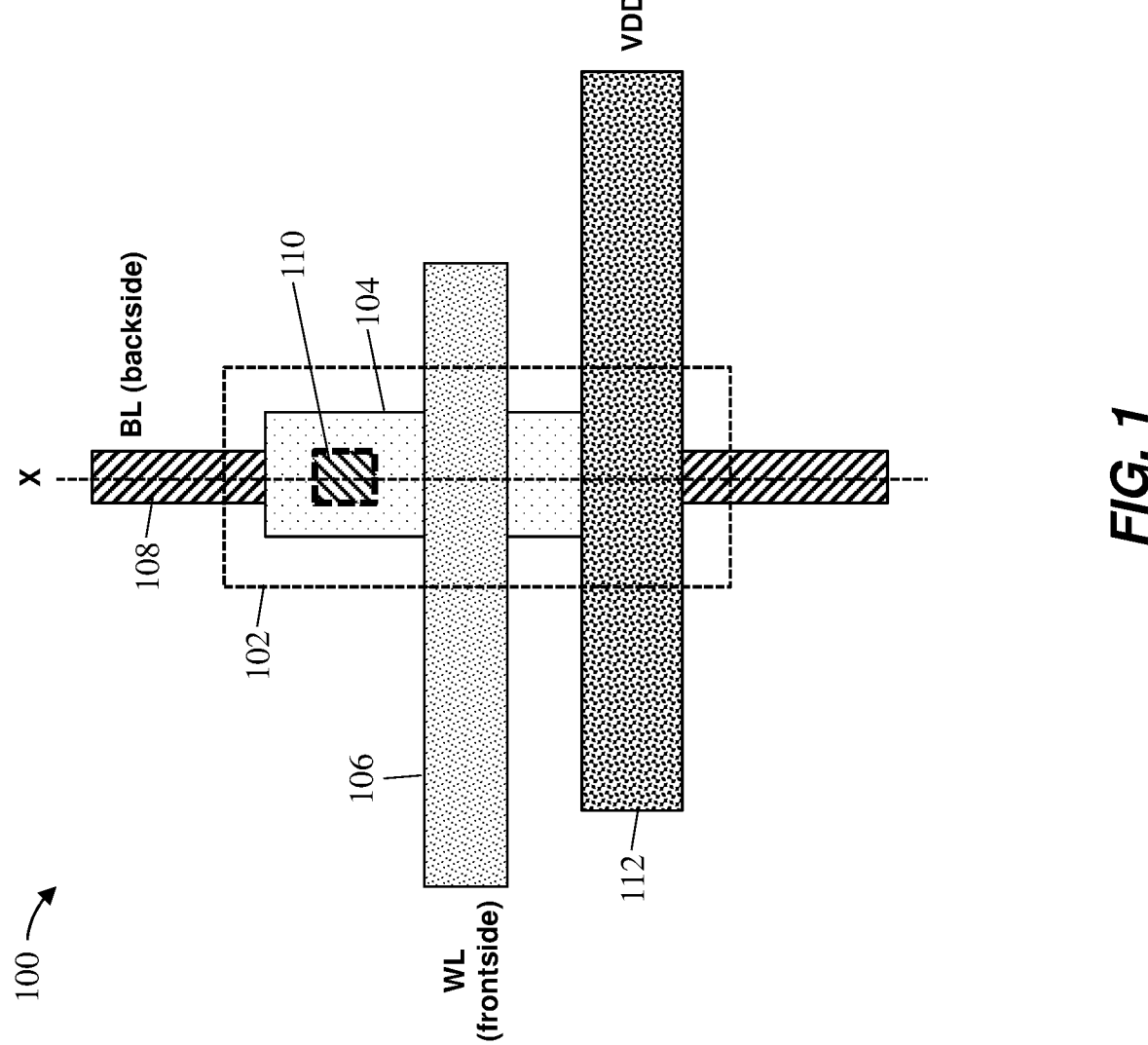
FIG. 1 depicts a top-down view of an integrated circuit having a backside programmable memory cell in accordance with one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, ICs are fabricated in a series of stages, including a front-end-of-line (FEOL) stage, a middle-of-line (MOL) stage, and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the IC. Most ICs need more than one layer of wires to form all the necessary connections, and as many as 5-12 layers are added in the BEOL process. The various BEOL layers are interconnected by vias that couple from one layer to another. Insulating dielectric materials are used throughout the layers of an IC to perform a variety of functions, including stabilizing the IC structure and providing electrical isolation of the IC elements. For example, the metal interconnecting wires in the BEOL region of the IC are isolated by dielectric layers to prevent the wires from creating a short circuit with other metal layers.

As discussed previously, a key component of the BEOL structure is the power delivery network (PDN). Backside power delivery (also referred to as a backside power delivery network) is a chip architecture that involves repositioning conductive (metal) layers of the PDN from the top of the FEOL to the opposite side of the chip. In other words, in a backside-style architecture the PDN layers are placed on the backside of the semiconductor substrate onto which the active devices have been built. Challenges remain, however, in fully leveraging backside metal architectures, such as the backside power delivery network, for next generation chip design and fabrication.

Generally, current wafer designs undergo a fabrication work flow where each respective wafer is sequentially FEOL processed, frontside BEOL processed, MOL processed, flipped, thinned, backside BEOL processed, and then finished (e.g., far back end of line or FBEOL, packaging, etc.). Making changes to any of the memory cells of each respective wafer requires a somewhat iterative process, whereby a new frontside mask is created and the sequential fabrication process restarts at the FEOL. Unfortunately, changes to the frontside mask impacts all downstream modules and results in a relatively long time-to-market.

Turning now to an overview of aspects of the present invention, one or more embodiments of the invention address the above-described shortcomings by providing fabrication methods and resulting structures for a backside programmable memory. As used herein, a "backside programmable memory" refers to a structural feature of one or more embodiments of this disclosure where one or more placeholder backside vias (also referred to as dummy backside vias) are built at the backside of a wafer so that a memory cell (or tuning circuit, eco logic path, etc.) can be customized simply by metalizing and/or connecting (or disconnecting) the one or more placeholder backside vias to backside wiring (e.g., a PDN, backside interconnect, etc.). In short, template circuits having a plurality of memory cells are formed on the front side of the wafer, and backside wiring (e.g., backside metals and vias) is formed on the back side of the wafer to program the behavior of the memory cells. Memory cells can be programmed by metallizing the placeholder backside vias and/or by making electrical contact to the placeholder backside vias from the backside wiring. For example, a ROM bitcell can be physically programmed by contacting (representing a bit value of "1")

or not contacting (representing a bit value of "0") the placeholder backside vias to the backside wiring. The backside vias themselves can be built during FEOL (e.g., after the source/drain recess) and/or MOL (e.g., deep via formation towards backside), as desired.

Advantageously, configuring a backside programmable memory in this manner allows for design changes to be made to on-chip memory cells without requiring a new frontside mask. Instead, the memory cells can be customized via a new backside mask without redoing the FEOL and the frontside BEOL, greatly reducing time-to-market. The backside mask can be changed to redefine which ones of the placeholder backside vias will be metalized and/or electrically coupled to the backside metal (e.g., a backside power delivery network) during the backside BEOL. This process can be referred to as "backside programming".

Backside programming enables a new type of two-phase wafer fabrication scheme where the front side of each wafer is processed with template memory cells (or tuning circuits, eco logic paths, etc.) that are programmable late in the wafer process cycle. In other words, wafer fabrication can be split into two general components: the frontside portion and the backside portion. The frontside portion includes the FEOL, the frontside BEOL, and in some scenarios, the MOL (i.e., in embodiments where placeholder vias are built MOL). The backside portion includes wafer thinning, the backside BEOL, and finishing modules. Notably, the FEOL and the frontside BEOL remain unchanged following any backside mask updates.

Moreover, backside programming memory cells in accordance with one or more embodiments enables backside interconnects (backside metals and/or vias) to selectively and physically program bits (rather than simply electrically programing from the backside). Such techniques are applicable to fixed programming in silicon and can substantially speed up process turn-around-times.

In some embodiments, a first, nontrusted foundry handles the frontside portion of wafer fabrication (including the creation of predefined memory cells and one or more placeholder backside vias) and a second, trusted foundry completes wafer fabrication (including electrically coupling one or more placeholder backside vias to backside metal to define the bit values of the memory cells). Advantageously, splitting the handling of wafer fabrication in this manner allows for secured wafer customization (via backside programming) while still allowing nontrusted foundries to complete the bulk of the fabrication process (i.e., through the frontside BEOL).

Turning now to a more detailed description of fabrication operations and resulting structures according to aspects of the invention, FIG. 1 depicts a top-down view of an integrated circuit 100 having a backside programmable memory cell 102 in accordance with one or more embodiments of the invention. As shown in FIG. 1, in some embodiments, the backside programmable memory cell 102 is configured as a metal-oxide-semiconductor (MOS) read-only memory (ROM). Other cell configurations, including additional mask-programmed/programmable ROM (PROM) architectures, such as diode ROMs, MOS OR ROM, MOS NAND ROM, etc., as well as non-PROM circuits (tuning circuit, eco logic path, etc.), are possible, and all such configurations are within the contemplated scope of this disclosure.

In some embodiments, the backside programmable memory cell 102 includes a device layer 104, frontside wiring above the device layer 104 (as shown, a frontside metallization layer 106 labeled "WL (frontside)", also referred to as a frontside "M$_1$" or, as configured here, as a word line), and backside wiring below the device layer 104 (as shown, a backside metallization layer 108 labeled "BL (backside)", also referred to as a backside M$_1$ "BSM$_1$", or, as configured here, as a bit line). In some embodiments, the frontside wiring is formed during the (frontside) BEOL and the backside wiring is formed during the backside BEOL (after wafer flipping and thinning). The backside programmable memory cell 102 further includes a voltage source ("VDD") 112.

Observe that, unlike in a conventional MOS ROM configuration where the WL, BL, and VDD are all frontside, one of the WL and the BL (here, the BL) is moved to the backside. Advantageously, the programming state (e.g., ROM state "1" or "0") of the backside programmable memory cell 102 can be set by backside programming a placeholder backside via 110. Programming the device layer 104 is discussed in greater detail with respect to FIGS. 2A and 2B.

In some embodiments, one or more of the placeholder backside vias 110 are distributed across each of a plurality of backside programmable regions (e.g., memory cells, tuning circuits, eco logic path, etc., not separately shown) of the integrated circuit 100, although the specific configuration and/or distribution of the placeholder backside vias 110 is not meant to be particularly limited. The particular configuration shown in FIG. 1 (i.e., a MOS ROM having a single placeholder backside via 110) is for ease of discussion and illustration only; other configurations are possible, and all such configurations are within the contemplated scope of this disclosure. As discussed previously, in some embodiments, various circuits can be formed from predefined arrays of cells (e.g., memory cells) on the front side of a wafer with frontside wiring (not separately shown). In some embodiments, these cells contain predefined locations for the placeholder backside vias 110.

Note that, while shown as having a single frontside metallization layer and a single backside metallization layer for ease of illustration and discussion, the integrated circuit 100 can include any number of frontside metallization layers (e.g, M$_1$ . . . M$_X$) and any number of backside metallization layers (e.g, BSM$_1$ . . . BSM$_X$) and all such configurations are within the contemplated scope of this disclosure.

Figure 2B:
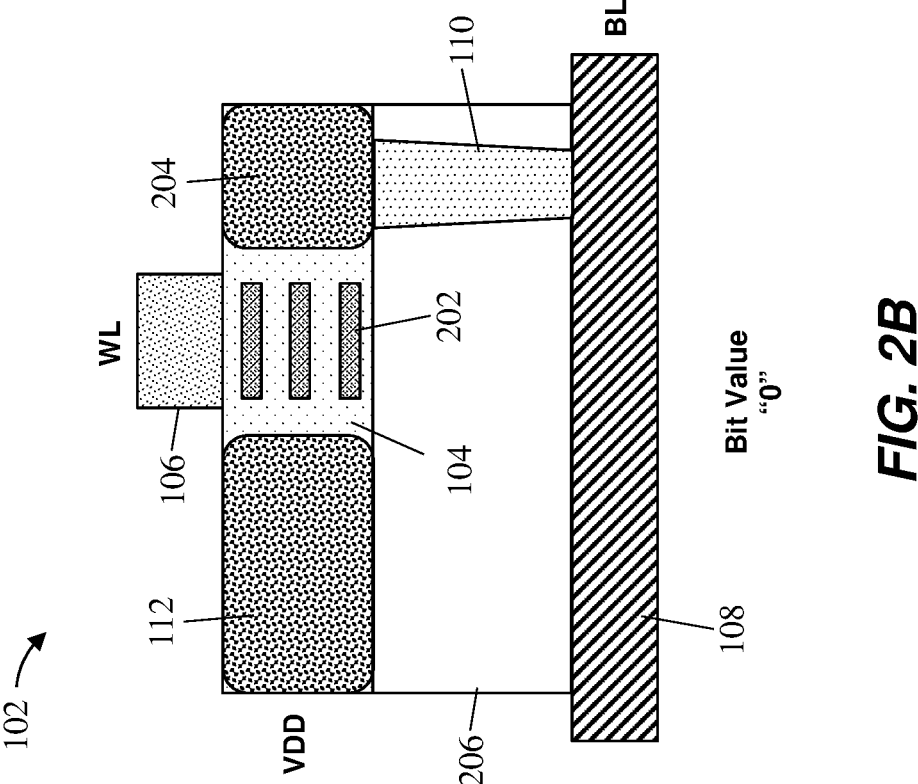
FIG. 2B depicts a cross-sectional view of the backside programmable memory cell shown in FIG. 1 along the line "X" in a second programming state in accordance with one or more embodiments of the invention.
Figure 2A:
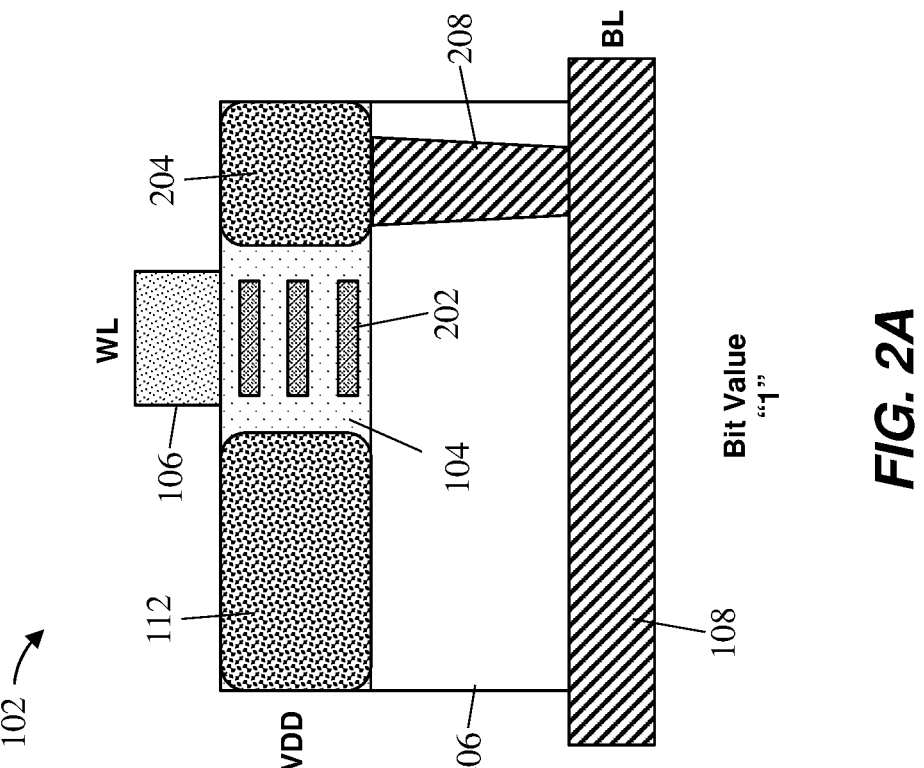
FIG. 2A depicts a cross-sectional view of the backside programmable memory cell shown in FIG. 1 along the line "X" in a first programming state in accordance with one or more embodiments of the invention.

FIGS. 2A and 2B depict cross-sectional views of the backside programmable memory cell 102 shown in FIG. 1 along the line "X" in a first programming state (bit value "1") and a second programming state (bit value "0"), respectively, in accordance with one or more embodiments of the invention. As shown in FIGS. 2A and 2B, the backside programmable memory cell 102 can include nanosheets 202 and a diffusion region 204 within the device layer 104, as well as a substrate 206 below the device layer 104 and one or more interlayer dielectrics (omitted for clarity), formed using FEOL processes. The backside programmable memory cell 102 is shown having a nanosheet-style transistor architecture. It should be understood that the nanosheet-style transistor architecture is provided for ease of discussion and illustration only, and that other transistor architectures (e.g., vertical tunneling transistors, planar transistors, finFETs, etc.) are within the contemplated scope of this disclosure.

As shown in FIG. 2B, the placeholder backside vias 110 can be formed using dielectric materials, such as, for example, silicon dioxide, silicon nitride, etc. In some embodiments, one or more of the placeholder backside vias 110 are formed in the FEOL. For example, in some embodiments, one or more trenches (not separately shown) are formed following the source/drain recess module and prior to source/drain epitaxial growth. Each trench can be filled with dielectric material to define a placeholder backside via 110. Fabrication can then continue using known FEOL, MOL, and BEOL processes, except that the placeholder backside vias 110 formed frontside during the FEOL are exposed from the backside following wafer flip and the backside thinning module. Once exposed, any number of placeholder backside vias 110 can be replaced with programmed backside vias 208 as shown in FIG. 2A.

In some embodiments, one or more of the placeholder backside vias 110 are formed in the MOL. For example, in some embodiments, one or more deep via trenches (not separately shown) are formed from the frontside to extend towards the backside after the replacement metal gate (RMG) module. Wafer fabrication can then proceed using known processes (e.g., MOL, BEOL, etc.), except that the deep vias formed frontside during the MOL are exposed from the backside following wafer flip and the backside thinning module. The exposed deep vias can be programmed (e.g., metalized and/or otherwise electrically coupled) to backside metal wiring according to one or more embodiments.

As shown in FIG. 2A, one or more of the placeholder backside vias 110 in the backside programmable memory cell 102 can be "programmed" by replacing the dielectric material with conductive material, such as, for example, copper, tungsten, etc. After programming, the vias are referred to as programmed backside vias 208. Once programming is complete (e.g., after metallization of one or more of the placeholder backside vias 110), the programmed backside vias 208 can be electrically coupled to backside wiring (e.g., the backside metallization layer 108). The specific configuration of the backside wiring is shown for ease of illustration and discussion only and is not meant to be particularly limited. In some embodiments, backside wiring electrically contacts multiple backside vias. In some embodiments, backside wiring is formed between a pair of through device region vias (e.g., programmed backside vias 208) in a manner that passes over one or more dummy through device region vias (e.g., placeholder backside vias 110). In any case, making electrical contact to one or more of the placeholder backside vias 110 can be referred to as "programming" the respective placeholder backside via.

In some embodiments, a specific mask(s) is created and applied to the integrated circuit 100 to select a specific subset of the placeholder backside vias 110 for programming. For example, a mask can be formed over the integrated circuit 100 having one or more exposed regions (i.e., those regions corresponding to vias selected for programming) and those exposed regions can be processed to replace the dielectric materials in the exposed vias with conductive materials.

Figure 3:
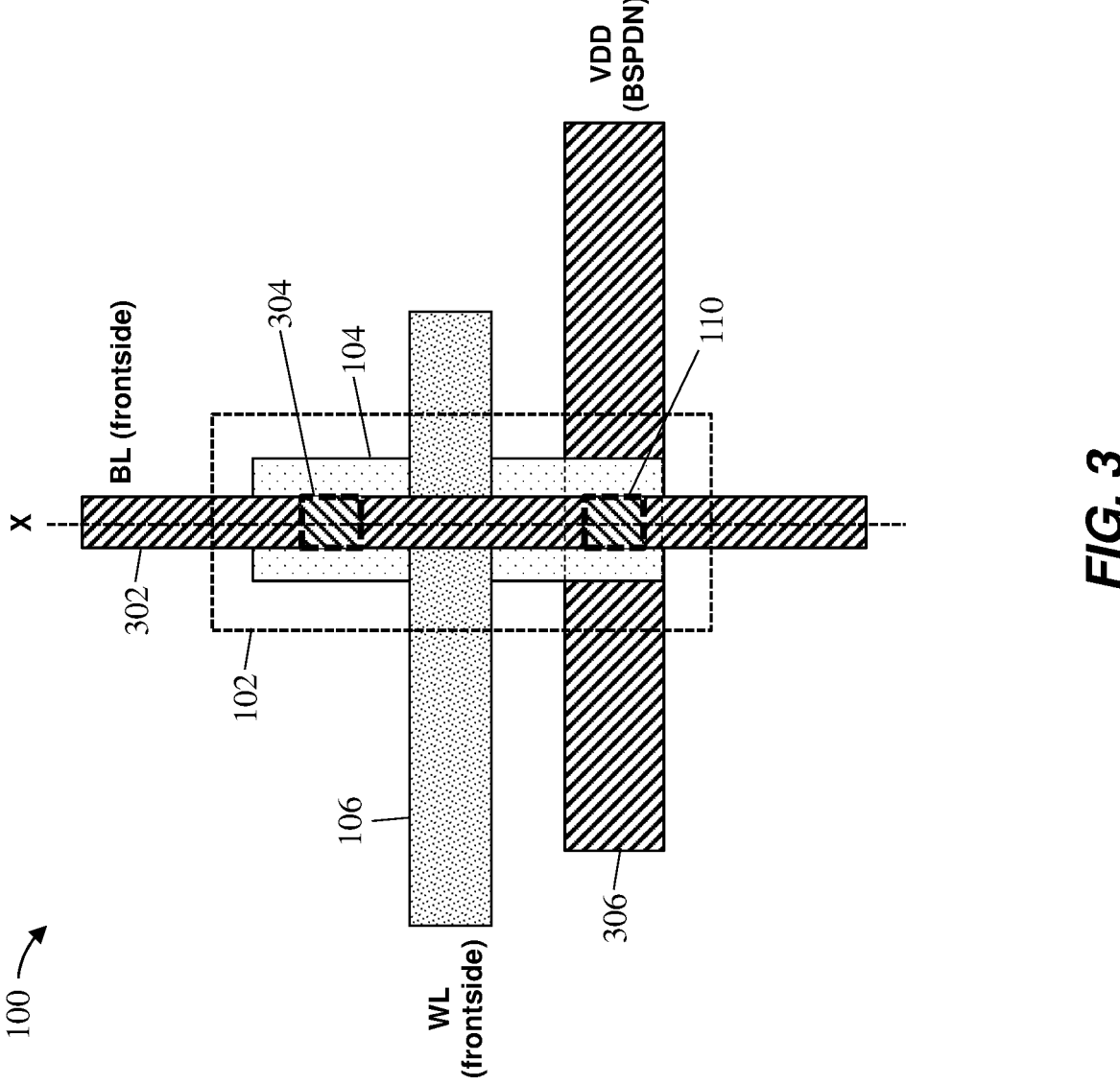
FIG. 3 depicts a top-down view of an integrated circuit in an alternative embodiment from that shown in FIG. 1.

FIG. 3 depicts a top-down view of an integrated circuit 100 in an alternative embodiment from that shown in FIG. 1. In contrast to the embodiment shown in FIG. 1, in some embodiments, one or more of the placeholder backside vias 110 of the backside programmable memory cell 102 are programmable via connections to a backside power supply (i.e., a PSPDN or backside VDD). The backside programmable memory cell 102 can be otherwise configured in a similar manner as described previously, for example, as a MOS ROM (as shown). Other cell configurations, including additional mask-programmed/programmable ROM (PROM) architectures, such as diode ROMs, MOS OR ROM, MOS NAND ROM, etc., as well as non-PROM circuits (tuning circuit, eco logic path, etc.), are possible, and all such configurations are within the contemplated scope of this disclosure.

In some embodiments, the backside programmable memory cell 102 includes a device layer 104, frontside wiring above the device layer 104, and backside wiring below the device layer 104. In some embodiments, the frontside wiring above the device layer 104 includes a frontside word line 106 labeled "WL (frontside)", a frontside bit line 302 labeled "BL (frontside)", and a frontside via 304 (as shown). In some embodiments, the backside wiring below the device layer 104 includes a backside power delivery network 306, labeled as "VDD (BSPDN)" (as shown).

Observe that, unlike in a conventional MOS ROM configuration where the WL, BL, and VDD are frontside, supply voltage (VDD) is provided backside (referred to as a BSPDN). Advantageously, the programming state (e.g., ROM state "1" or "0") of the backside programmable memory cell 102 can be set using a programmable via connection (e.g., one or more placeholder backside vias 110) to the backside power supply. The programmable via connection to backside power is discussed in greater detail with respect to FIGS. 4A and 4B.

Figure 4B:
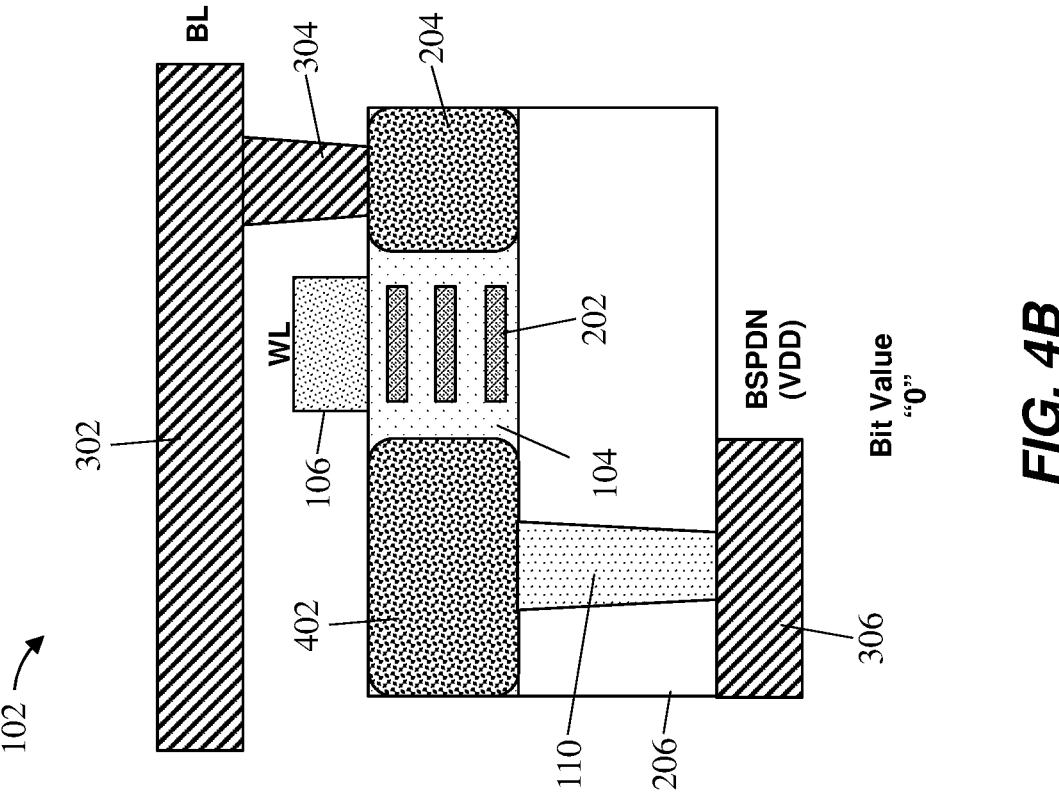
FIG. 4B depicts a cross-sectional view of the backside programmable memory cell shown in FIG. 3 along the line "X" in a second programming state in accordance with one or more embodiments of the invention.
Figure 4A:
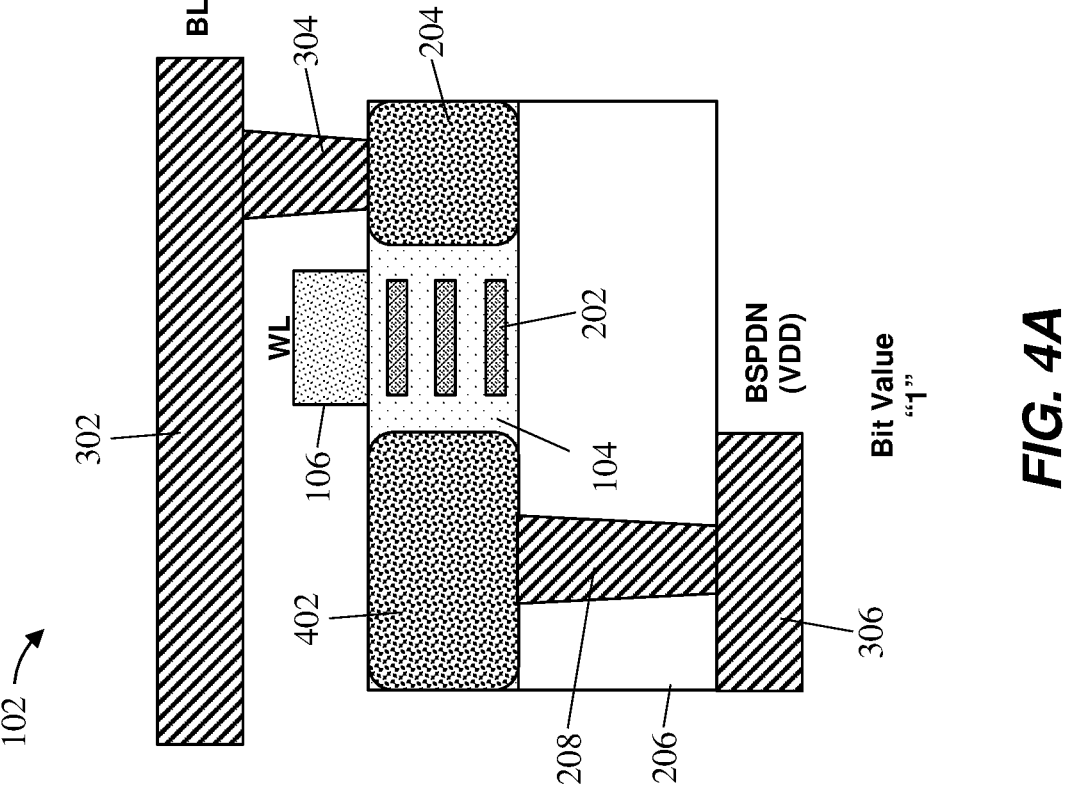
FIG. 4A depicts a cross-sectional view of the backside programmable memory cell shown in FIG. 3 along the line "X" in a first programming state in accordance with one or more embodiments of the invention.

FIGS. 4A and 4B depict cross-sectional views of the backside programmable memory cell 102 shown in FIG. 3 along the line "X" in a first programming state (bit value "1") and a second programming state (bit value "0"), respectively, in accordance with one or more embodiments of the invention. As shown in FIGS. 4A and 4B, the backside programmable memory cell 102 can include nanosheets 202 and diffusion regions 204, 402 within the device layer 104, as well as a substrate 206 below the device layer 104 and one or more interlayer dielectrics (omitted for clarity), formed using FEOL processes. The backside programmable memory cell 102 is shown having a nanosheet-style transistor architecture. It should be understood that the nanosheet-style transistor architecture is provided for ease of discussion and illustration only, and that other transistor architectures (e.g., vertical tunneling transistors, planar transistors, finFETs, etc.) are within the contemplated scope of this disclosure.

As shown in FIG. 4B, the placeholder backside vias 110 can be formed using dielectric materials, such as, for example, silicon dioxide, silicon nitride, etc. The one or more placeholder backside vias 110 can be formed in the FEOL or MOL as discussed previously with respect to FIGS. 2A and 2B. Fabrication can then continue using known FEOL, MOL, and BEOL processes, except that the placeholder backside vias 110 formed frontside during the FEOL and/or MOL are exposed from the backside following wafer flip and the backside thinning module. Once exposed, any number of placeholder backside vias 110 can be replaced with programmed backside vias 208 as shown in FIG. 4A.

As shown in FIG. 4A, one or more of the placeholder backside vias 110 in the backside programmable memory cell 102 can be "programmed" by replacing the dielectric material with conductive material, such as, for example, copper, tungsten, etc. After programming, the vias are referred to as programmed backside vias 208. Once programming is complete (e.g., after metallization of one or more of the placeholder backside vias 110), the programmed backside vias 208 can be electrically coupled to backside wiring (e.g., the BSPDN 306). The specific configuration of the backside wiring is shown for ease of illustration and discussion only and is not meant to be particularly limited. In some embodiments, backside wiring electrically contacts multiple backside vias. In some embodiments, backside wiring is formed between a pair of through device region vias (e.g., programmed backside vias 208) in a manner that passes over one or more dummy through device region vias (e.g., placeholder backside vias 110). In any case, making electrical contact to one or more of the placeholder backside vias 110 can be referred to as "programming" the respective placeholder backside via.

In some embodiments, a specific mask(s) is created and applied to the integrated circuit 100 to select a specific subset of the placeholder backside vias 110 for programming. For example, a mask can be formed over the integrated circuit 100 having one or more exposed regions (i.e., those regions corresponding to vias selected for programming) and those exposed regions can be processed to replace the dielectric materials in the exposed vias with conductive materials.

Figure 5:
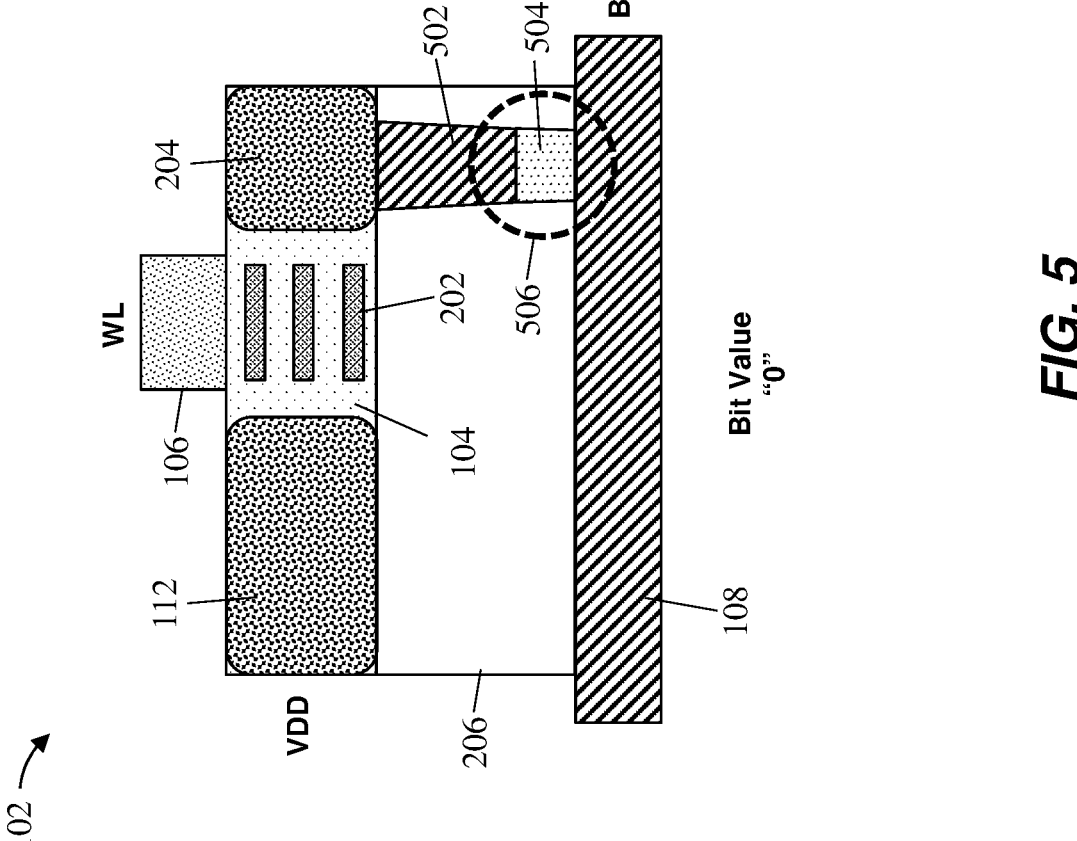
FIG. 5 depicts a cross-sectional view of the backside programmable memory cell along the line "X" of FIG. 1 in an alternative embodiment from that shown in FIG. 2B.

FIG. 5 depicts a cross-sectional view of the backside programmable memory cell 102 along the line "X" of FIG. 1 in an alternative embodiment from that shown in FIG. 2B. In contrast to the embodiment shown in FIG. 2B, in some embodiments, all of the placeholder backside vias 110 are prefilled with conductive material (forming, effectively, a plurality of placeholder conductive backside vias 502).

In some embodiments, one or more of the placeholder conductive backside vias 502 are recessed to prevent contact to the backside wiring (e.g., the backside metallization layer 108 labeled "BL"). In some embodiments, one or more of the placeholder conductive backside vias 502 are recessed and the removed conductive material is replaced with dielectric material 504, as shown in region 506. Remaining placeholder conductive backside vias 502 are electrically coupled to the backside wiring (e.g., the backside metallization layer 108). Placeholder conductive backside vias 502 coupled to the backside wiring can be referred to as programmed backside vias 208.

Figure 6:
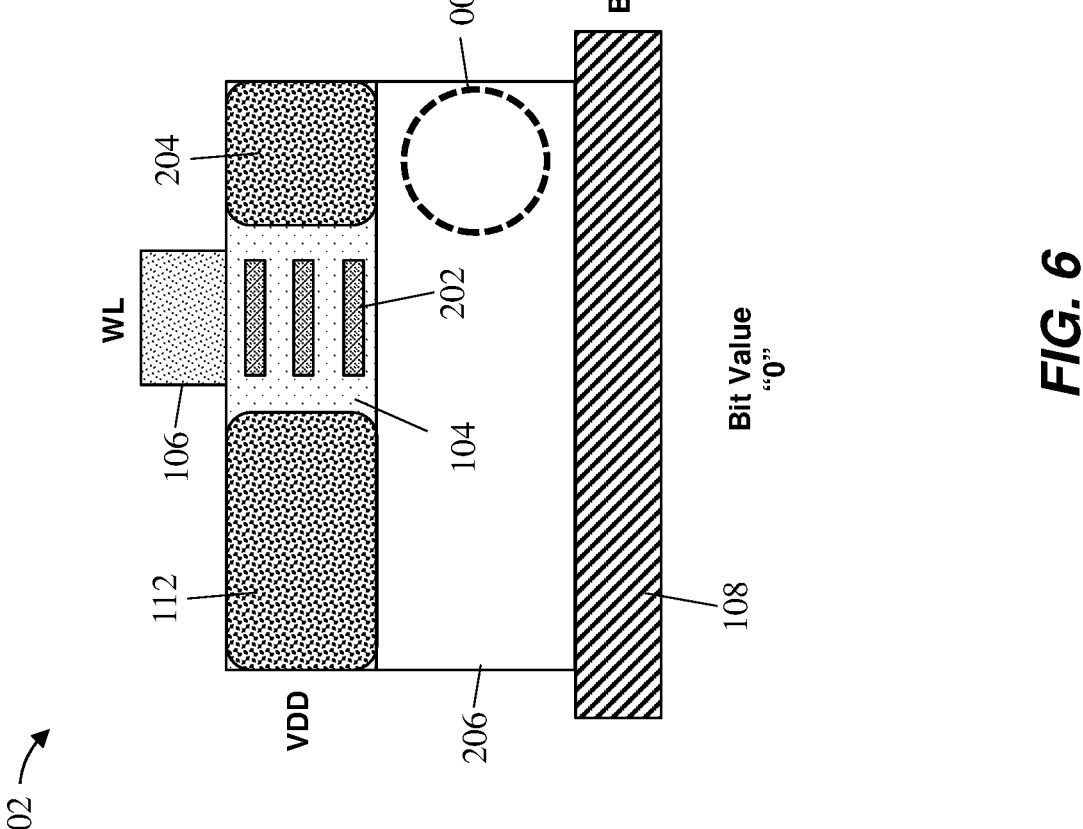
FIG. 6 depicts a cross-sectional view of the backside programmable memory cell along the line "X" of FIG. 1 in yet another alternative embodiment from that shown in FIG. 2B.

FIG. 6 depicts a cross-sectional view of the backside programmable memory cell 102 along the line "X" of FIG. 1 in an alternative embodiment from that shown in FIG. 2B. In contrast to the embodiment shown in FIG. 2B, in some embodiments, unselected ones of the placeholder backside vias 110 are removed to electrically disconnect the bit line (e.g., the backside metallization layer 108) from the backside programmable memory cell 102. The placeholder backside vias 110 can be removed using any suitable process, such as, for example, using a wet etch, a dry etch, and/or one or more sequential wet and/or dry etches.

Figure 7:
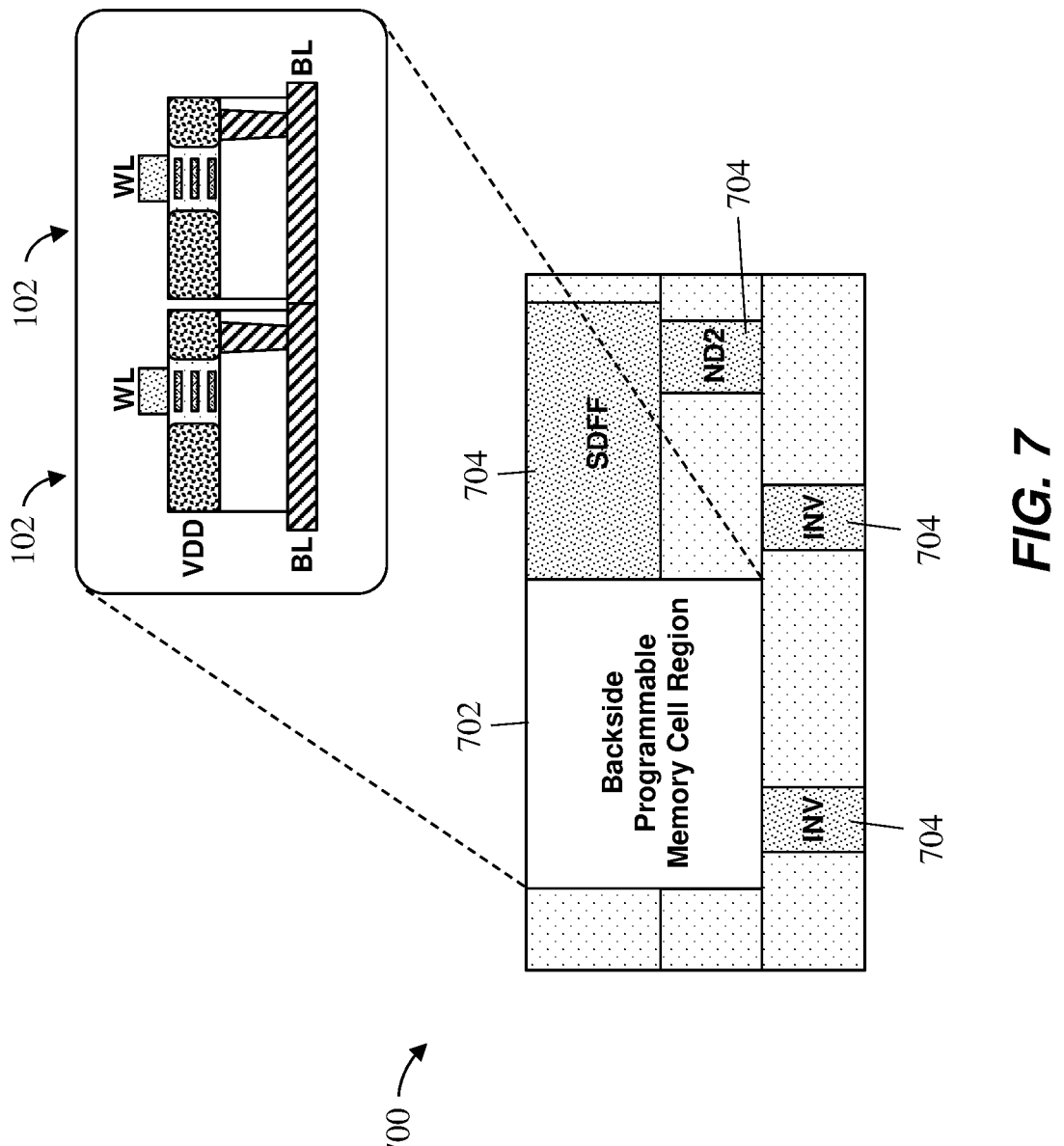
FIG. 7 depicts a top-down view of an integrated circuit having an intermixed backside programmable memory cell region formed in accordance with one or more embodiments of the invention.

FIG. 7 depicts a top-down view of an integrated circuit 700 having a backside programmable memory cell region 702 formed in accordance with one or more embodiments of the invention. As shown in FIG. 7, in some embodiments, the integrated circuit 700 can include one or more backside programmable memory cell regions 702 intermixed with one or more additional cells 704 (as shown, for example only, two inverter (INV) cells, a Scan-able D-flip-flop (SDFF) cell, and a 2-input NAND (ND2) cell). As further shown in FIG. 7, the backside programmable memory cell region 702 can include a plurality of backside programmable memory cells 102, each formed according to one or more embodiments. The additional cells 704 are not meant to be particularly limited, and could include, for example, various memory cells (RAM, ROM, etc.) and/or logic circuits (e.g., NAND2, INV, LATCH, etc.).

FIG. 8 depicts a flow diagram illustrating a method 800 for providing integrated circuits having backside programmable cells according to one or more embodiments of the invention. As shown at block 802, a front end of line structure having a plurality of programmable cells is formed. In some embodiments, one or more of the programmable cells are programmable memory cells. In some embodiments, each programmable cell includes a backside via in direct contact with a device region of the respective cell. In some embodiments, the device region includes a diffusion region of a memory cell. In some embodiments, a first portion of the backside vias defines one or more placeholder backside vias and a second portion of the one or more backside vias defines one or more programmed backside vias.

At block 804, a back end of line structure is formed on a first surface of the front end of line structure. In some embodiments, the back end of line structure includes a programmable cell control signal line. In some embodiments, the programmable cell control signal line includes a word line (e.g., FIG. 1). In some embodiments, the back end of line structure includes a word line and a bit line (e.g., FIG. 3).

At block 806, a backside structure is formed on a second surface of the front end of line structure opposite the first surface. In some embodiments, the backside structure includes a backside metallization layer in direct contact with the one or more programmed backside vias. In some embodiments, the backside metallization layer includes a sensing signal line. In some embodiments, the sensing signal line includes a bit line (e.g., FIG. 1). In some embodiments, the backside metallization layer includes a backside power delivery network (e.g., FIG. 3).

In some embodiments, the plurality of memory cells define a mask-programmed read-only memory (PROM). In some embodiments, the PROM includes a MOS NOR ROM.

In some embodiments, the one or more programmed backside vias are selected such that a portion of the plurality of memory cells defines the bit values of the PROM. In some embodiments, memory cells having a placeholder backside via define a first bit value and the memory cells having a programmed backside via define a second bit value.

In some embodiments, the one or more placeholder backside vias include a dielectric material and the one or more programmed backside vias include a conductive material. In some embodiments, the backside metallization layer is in direct contact with the backside vias.

In some embodiments, the one or more placeholder backside vias and the one or more programmed backside vias include a conductive material. In some embodiments, the one or more placeholder backside vias are recessed with respect to the one or more programmed backside vias to prevent direct contact with the backside metallization layer.

In some embodiments, the method includes forming a backside programmable memory cell region comprising the plurality of memory cells and one or more additional regions intermixed with the backside programmable memory cell region.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop (i.e., the second element remains).

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a <100> orientated crystalline surface can take on a <100> orientation. In some embodiments of the invention of the invention, epitaxial growth and/or deposition processes can be selective to forming on semiconductor surface, and may or may not deposit material on other exposed surfaces, such as silicon dioxide or silicon nitride surfaces.

As used herein, "p-type" refers to the addition of impurities to an intrinsic semiconductor that creates deficiencies of valence electrons. In a silicon-containing substrate, examples of p-type dopants, i.e., impurities, include but are not limited to, boron, aluminum, gallium, and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:

forming a front end of line structure comprising a plurality of programmable cells, each programmable cell comprising a backside via in direct contact with a device region of the respective programmable cell, wherein a first portion of the backside vias in each of the plurality of programmable cells defines one or more placeholder backside vias and a second portion of the backside vias in each of the plurality of programmable cells defines one or more programmed backside vias, wherein forming the front end of line structure comprises:

forming a backside via comprising a dielectric material in each respective programmable cell;

forming a mask over the backside vias, the mask patterned to selectively expose the second portion of the backside vias;

remove the dielectric material from the exposed second portion of the backside vias; and replace the dielectric material with conductive material in the exposed second portion of the backside vias;

forming a back end of line structure on a first surface of the front end of line structure, the back end of line structure comprising a programmable cell control signal line; and forming a backside structure on a second surface of the front end of line structure opposite the first surface, the backside structure comprising a backside metallization layer in direct contact with the one or more programmed backside vias, the backside metallization layer comprising a sensing signal line.

2. The method of claim 1, wherein the programmable cells having a placeholder backside via define a first bit value and the programmable cells having a programmed backside via define a second bit value.

3. The method of claim 1, wherein the one or more placeholder backside vias comprise a dielectric material and the one or more programmed backside vias comprise a conductive material.

4. The method of claim 3, wherein the backside metallization layer is in direct contact with the backside vias.

5. The method of claim 1, wherein the one or more placeholder backside vias and the one or more programmed backside vias comprise a conductive material.

6. The method of claim 5, wherein the one or more placeholder backside vias are recessed with respect to the one or more programmed backside vias to prevent direct contact with the backside metallization layer.

7. The method of claim 1, wherein the one or more programmed backside vias are selected such that a portion of the plurality of programmed cells defines a mask-programmed read-only memory (PROM).

8. The method of claim 1, further comprising forming a backside programmable memory cell region comprising the plurality of programmed cells and one or more additional regions intermixed with the backside programmable memory cell region.

* * * * *